United States Patent [19]

West et al.

[11] Patent Number: 5,397,943

[45] Date of Patent: Mar. 14, 1995

[54] CLOCK DISTRIBUTION METHOD AND APPARATUS FOR HIGH SPEED CIRCUITS WITH LOW SKEW USING COUNTERPROPAGING TRUE AND COMPLEMENT RE-GENERATED CLOCK SIGNALS WITH PREDETERMINED RAMP SHAPES

[75] Inventors: Burnell G. West, Fremont; Madhukar B. Vora, Los Gatos, both of Calif.

[73] Assignee: Dyna Logic Corporation, Sunnyvale, Calif.

[21] Appl. No.: 88,982

[22] Filed: Jul. 8, 1993

Related U.S. Application Data

[63] Continuation-in-part of Ser. No. 2,172, Jan. 8, 1993.

[51] Int. Cl.⁶ .................. H03K 19/096; H03K 5/12; H03K 19/177
[52] U.S. Cl. ..................................... 326/39; 326/93; 326/21; 327/292
[58] Field of Search ............... 307/263, 264, 443, 480, 307/465,

[56] References Cited

U.S. PATENT DOCUMENTS

| | | | |
|---|---|---|---|
| 4,812,684 | 3/1989 | Yamagiwa et al. | 307/443 |
| 5,045,725 | 9/1991 | Sasaki et al. | 307/443 |
| 5,066,877 | 11/1991 | Hamano et al. | 307/603 |
| 5,172,330 | 12/1992 | Watanabe et al. | 307/480 |

*Primary Examiner*—Edward P. Westin
*Assistant Examiner*—Benjamin D. Driscoll
*Attorney, Agent, or Firm*—Ron Fish

[57] ABSTRACT

There is disclosed herein a method and apparatus for distributing high speed clock signals on an integrated circuit while eliminating clock skew. The invention is particularly useful in field programmable gate arrays where the signal paths are defined by the user after the integrated circuit leaves the place of manufacture and enables field programmable gate arrays to operate at clock speeds in excess of 200 MHz, a speed not previously attainable. Clock skew is eliminated by generating differential clock signals at each of four corners of the array from master differential clock signal delivered simultaneously to each of the four corners. The differential clock signals generated at each corner have ramps the rise time of which slightly exceeds the propagation delay of a clock signal traversing the array. The true signal is propagated across both the top and bottom of the array of cells in the same direction and the complement clock signal is propagated across both the top and bottom of the array of cells in the opposite direction. At the top and bottom of each column, secondary clock receivers receive the true and complement clock signals and generate new differential column clock signals with ramps that are triggered at the time at each column when the true and complement clock signals "crossover", i.e., are equal in amplitude. The ramps of these column clock signals also have rise times which slightly exceed the propagation delay of a clock signal propagating down a column. The differential clock signals are generated at the top and bottom of each column. The true clock signal generated at the top of each column is propagated down each column and the complement clock signal generated at the bottom of each column is propagated up the column. Each cell uses as its clock marker the crossover point between the counter-propagating true and complement clock signals.

8 Claims, 2 Drawing Sheets

CLOCK DISTRIBUTION METHOD AND APPARATUS FOR HIGH SPEED CIRCUITS WITH LOW SKEW USING COUNTERPROPAGING TRUE AND COMPLEMENT RE-GENERATED CLOCK SIGNALS WITH PREDETERMINED RAMP SHAPES

BACKGROUND OF THE INVENTION

This is a continuation-in-part of a U.S. Patent application entitled BICMOS REPROGRAMMABLE LOGIC, filed Jan. 8, 1993, Ser. No. 08/002,172 by Madhu Vora and Burnell West, the text of which is hereby incorporated by reference.

The invention pertains to the field of clock distribution circuitry to minimize "clock skew", i.e., different arrival times for clock pulses at different points on an integrated circuit because of differing path lengths. More precisely, the invention pertains to the problem of minimizing clock skew in a field programmable gate array or any other logic circuit with programmable data paths where the length, routing, propagation delays, number of devices imposing delays and other factors affecting propagation delays of clock signals can change as the device is programmed into different configurations in the field.

In integrated circuit designs, a typical high speed structure involves a plurality of registers, including an input register to store the "vector" or logical data upon which a collection of logic gates is to operate to carry out some mathematical or logical operation and one or more registers to store the results of calculations or logic operations performed by the preceding collection of logic gates. These registers typically require that the data which they are to store must stabilize at their data inputs at least one "setup time" before the occurrence of the clock or strobe signal which latches the data into the register. Likewise, the data signals must typically remain in a stable state for at least one "hold time" after the clock pulse has arrived and loading has occurred for correct operation of the register. Clock skew can result in the clock signals at various registers throughout an integrated circuit arriving at different times. This can cause failure to conform to the above described requirements for setup time and hold time which can cause misbehavior of the integrated circuit or failure of the circuit to operate properly.

The problem of clock skew in conventional integrated circuits with fixed layouts and signal paths has been handled in several ways in the prior art. One way is to custom tailor the layout and signal paths to impose appropriate delays to satisfy the various setup time and hold time requirements. A way of handling clock skew in the prior art is with various tree structures such as by feeding the clock signals in at the center of the integrated circuit surface upon which the circuit is formed and letting the signal propagate outward toward the edges of the integrated circuit. Another way clock skew has been handled in the prior art is by organizing the clock tree such that the direction of clock signal propagation is parallel to the direction of signal flow.

The problem arises in programmable devices having very high clock speeds above 200 Mhz and where the circuit topology can be altered in the field by a user. In such devices, the clock time variation at various points in the device can be as much as one nanosecond or more. This degree of clock skew is too high, and, as a result, until the invention described herein, clock speeds much higher than 200 Mhz were inconsistent with the demands of programmable devices. As a result, typical field programmable gate arrays in todays art run at a maximum clock speed of 40–50 Mhz. A need exists to extend the field programmable gate array technology to 200–500 Mhz clock speeds. Therefore, a need has arisen to minimize the clock skew in such a field programmable gate array.

SUMMARY OF THE INVENTION

According to the teachings of the invention, there is disclosed a method and apparatus for distributing high speed clock pulses on an integrated circuit structure for a programmable circuit such as a field programmable gate array in such a way that the "effective arrival time"(referred to in the claims as the "clock marker") of the clock signal at any node or cell within an array of cells differs by an amount much less than the signal propagation delay across the integrated circuit. High speed clock signals as the term is used herein and in the claims is intended generally to refer to any clock speed which is high enough that clock skew becomes a significant problem. Typically, this means clock speeds in excess of 200 MHz, but clock speeds less than 200 MHz can also cause the clock skew problem, and the invention is equally applicable to integrated circuits operating at these lower clock speeds even though the teachings of the invention are most valuable in field programmable gate arrays and other field programmable structures where clock speeds equal or exceed 200 Mhz.

The advantages of the invention are that clock skew can be eliminated or substantially reduced in a field programmable gate array operating at high clock speeds despite the fact that the direction and length of the data paths of the integrated circuit are not known when the integrated circuit leaves the manufacturer's premises and are determined later when the user programs the desired function for the array. This advantage is achieved by generating specifically shaped differential trapezoidal clock signals comprised of a true and complement signal at each corner of the array in master clock receiver and distributor cells located at each of the four corners of the array. Then the true signals generated at the upper left and lower left corners of the array are transmitted from left to right across two parallel clock buses running parallel to the top and bottom edges of the array. The complement clock signals generated at the master clock receiver and distributor circuits at the upper right and lower right corners of the array are transmitted from right to left across the two parallel clock buses along the top and bottom edges of the array. In the preferred embodiment, each clock bus has two conductors, one for the true clock signal and one for the complement clock signal. The shapes of these true and complement clock signals include ramps the duration of which is slightly longer (typically 20% or less longer but possibly greater than 20% where maximizing clock speed is not of paramount importance) than the propagation delay experienced by a clock signal as it propagates along either of the parallel clock buses running along the top and bottom edges of the array. This shape for the clock signal ramps causes the crossover point between the true and complement clock signals propagating in opposite directions, i.e., the point where the amplitudes of the two signals is substantially equal, to occur at the same time at the top and bottom of each column in the array. This is true even though the propagation delay for the true signals in travelling from the left edge of the array to any particular column along the clock buses on the top and bottom edges of the array is different as is the propagation delay for the complement signals in travelling along the clock buses from the right edge of the array to any particular column. Since it is important that the rise time of the ramps of the differential clock signals match at all four corners of the array, it is important to use matched components in the circuits that generate the differential clock signals at each corner of the array since it is the electrical characteristics of the transistors and diodes and capacitors which determine the ramp rise times. Normally in integrated circuit processes, the devices created at different places on the integrated circuit die have fairly closely matched characteristics. But in applications of the invention in a non-integrated environment such as a super computer backplane, it is important to use matched components if clock circuits like that shown in FIG. 4 are used.

At the top and bottom of each column of cells in the array, there is located a secondary clock receiver and distributor, which is typically of the same constructions as the master clock receiver and distributor cells. The purpose of each of these secondary clock receiver and distributor circuits is to generate new differential clock signals for the columns of cells from the counter-propagating true and complement clock signals generated by the master clock receiver and distributor circuits. Each of the secondary clock receiver and distributor circuits has one differential input coupled to receive the true clock signal and one differential input coupled to receive the complement clock signal. When these two clock signals "crossover", i.e., have equal amplitudes, at any particular column the differential amplifier of the corresponding secondary clock receiver and distributor circuits switches states and a new ramp portion of the differential clock signals being generated for each column is commenced. The resistance of the transistors and diodes and the capacitance of the capacitor in the secondary clock receiver and distributor circuits must be established such that the ramp rise times of the true and complement clock signals generated by the secondary clock receiver and distributor circuits is slightly longer than the propagation delay of a clock signal down the column. Because the ramp rise times of the true and complement clock signals generated by the master clock receiver and distributor cells are slightly longer than the propagation delay of the clock signal across the top bottom clock bus of the array, the crossover point of the counter-propagating true and complement signals at each column location occurs at the same time. Under this same principle, the true clock signal generated by the secondary clock receiver and distributor cell at the top of each column is transmitted down one conductor of a column clock bus running the length of the column. The paired secondary clock receiver and distributor cell at the bottom of each column then transmits the complement clock signal up the column clock bus on another conductor thereof. The crossover point of the counter-propagating true and complement clock signal on each column bus is used by each cell in the column as a clock marker. These crossover points at each cell location occur at substantially the same time thereby substantially eliminating clock skew.

As those skilled in the art will appreciate, the teachings of the invention are not limited to transmitting the counter-propagating differential clock signals from the master clock receiver and distributor cells horizontally across the top and bottom edges of the array. These signals may also be counter-propagated vertically along the left and right vertical edges of the array. Likewise it does not matter if the true signal is propagated from left to right or from right to left for horizontal counter-propagation, and it does not matter in vertical counter-propagation whether the true signal is sent from top to bottom or from bottom to top. Either direction in either case will suffice as long as the complement signal is counter-propagated in the opposite direction. The same is true for the secondary clock receiver and distributor cells. They may be located at the top and bottom of each column or at the left and right edges and the true and complement signals may be counter-propagated in any direction.

DETAILED DESCRIPTION OF THE PREFERRED EMBODIMENT

Figure 1:
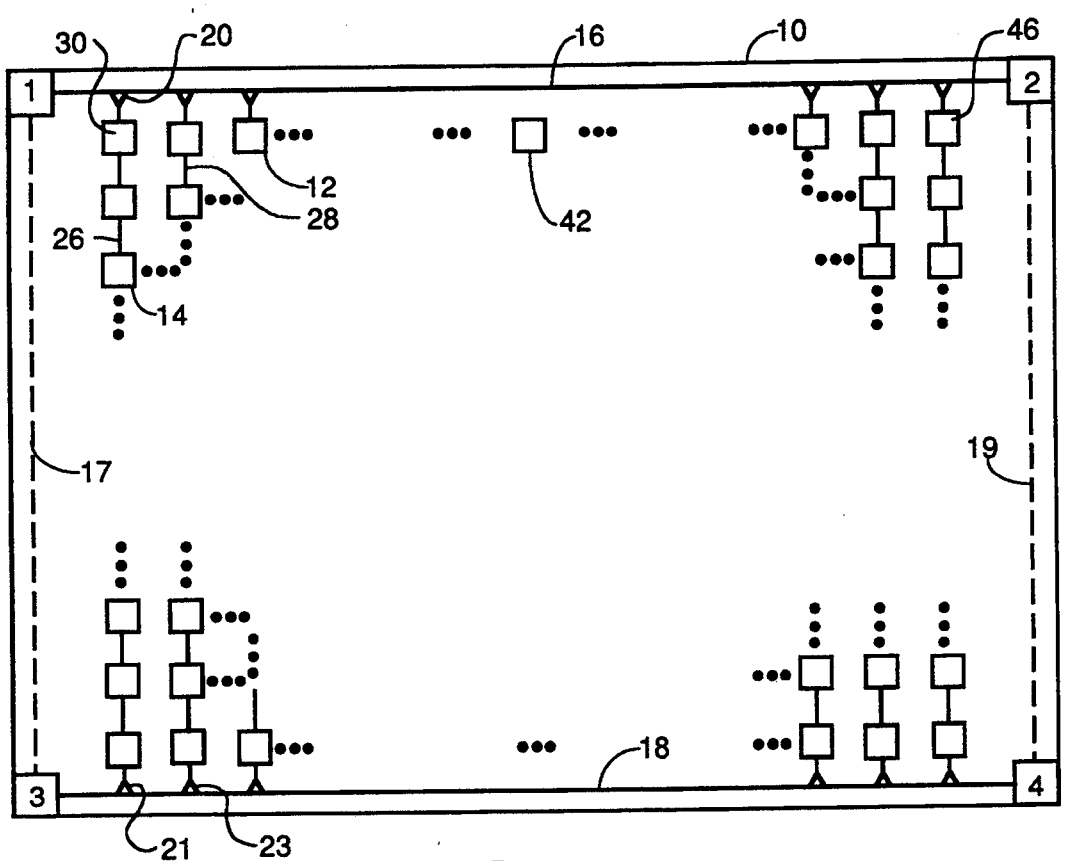
FIG. 1 is a symbolic drawing of a field programmable gate array utilizing the teachings of the invention.

Referring to FIG. 1, there is shown a symbolic diagram of an integrated circuit comprised of an array of programmable cells employing the teachings of the invention. The integrated circuit 10 is comprised of an array of any size of programmable cells of which cells 12 and 14 are typical. Each cell in the array has a clock input and can be programmed to perform various logic functions such as to act as one bit in a register. Through interconnection circuitry (not shown) of the type described in the parent application which is hereby incorporated by reference, data signals from any cell in the array can be routed in field programmable fashion to any other cell in the array. Thus, the direction in which data flows across the integrated circuit 10 depends upon the programming supplied by the user.

At each corner of the array there is located a master clock receiver and distributor cell (hereafter sometimes referred to as a master clock distributor). These circuits are symbolized by the boxes at the corners of the array labelled 1, 2, 3 and 4. The purpose of this circuit is to generate clock signals having a specific ramp slope which are triggered by a pulse or other signal from master clock located off the integrated circuit 10. Typically, the master clock signals generated externally are a pair of differential clock signals delivered simultaneously to each master clock generator and distributor cell located at a corner of said array. Each master clock distributor cell distributes these specifically shaped ramp signals to the cells in the array in either of two specific propagation directions. Specifically, each master clock distributor can generate and distribute a clock signal either vertically or horizontally. That is, master clock distributor 1 can generate the true clock ramp signal and transmit it horizontally from left to right toward master clock distributor cell 2 along an the A conductor of clock bus 16 or transmit it vertically from top to bottom, toward master clock distributor 3 along the A conductor of clock bus 17. Likewise, master clock distributor 2 can generate the complement clock ramp signal and transmit it horizontally from right to left toward master clock distributor cell 1 along the B conductor of clock bus 16 or transmit it vertically from top to bottom toward master clock distributor 4 along the B conductor of clock bus 19. Likewise, master clock distributor 3 can generate the true clock ramp signal and transmit it horizontally from left to right toward master clock distributor cell 4 along the A conductor of clock bus 18 or generate the complement clock signal and transmit it vertically from bottom to top toward master clock distributor 1 along the B conductor of clock bus 17. Finally, master clock distributor 4 can generate the complement clock ramp signal and transmit it horizontally from right to left toward master clock distributor cell 3 along the B conductor of clock bus 18 or generate the true clock signal and transmit it vertically from bottom to top toward master clock distributor 2 along the A conductor of clock bus 19. It is not necessary to transmit the differential clock signals in opposite directions both vertically and horizontally from each master clock receiver and distributor. It is enough if master clock distributor cell 1 distributes the true clock signal from left to right on the A conductor of clock bus 16, and master clock distributor 2 distributes the complement signal from right to left on the B conductor of clock bus 16 while master clock distributor cell 3 distributes the true clock signal from left to right on the A conductor of clock bus 18, and master clock distributor 4 distributes the complement signal from right to left on the B conductor of clock bus 18. In such a case, buses lines 17 and 19 are superfluous and not necessary to operation of the invention. As such, these lines are shown as dashed lines symbolic of the fact that these lines symbolize an alternative embodiment. In the alternative embodiment, the master clock distributor cell pairs distribute their complementary clock signals vertically in opposite directions along lines 17 and 19, and a plurality of secondary clock receivers and distributors coupled to lines 17 and 19, one per row, receive these complementary clock signals and regenerate and buffer them for retransmission horizontally along each row in the same way as is described herein for the operation of secondary clock receivers and distributors 20, 21, 23 etc.

The trigger pulse from the master clock located off the integrated circuit must arrive at the trigger inputs of all four master clock receiver and distributors simultaneously. The current level of skill in the art of printed circuit board design is fully capable of arranging clock trigger signals delivery to all four master clock generators and distributors to a tolerance of ±25 picoseconds or less. With the teachings of the invention, it is possible to reduce clock skew on board the integrated circuit to similar levels.

Figure 2:
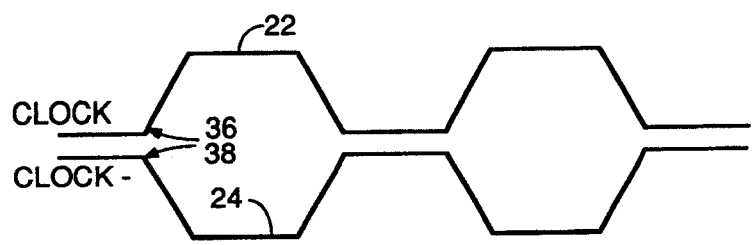
FIG. 2 is a timing diagram of two differential clock signals generated by each master clock receiver and distributor circuit and by each secondary clock receiver and distributor.

One purpose of the master clock generator and distributor circuits is to generate symmetrical, differential, trapezoidal clock signals of the form shown in FIG. 2 at each corner of the integrated circuit. According to the teachings of the invention, one of these two complementary, symmetrical signals is propagated across the array in one direction by one of the master clock generator and distributor circuits, and the complementary signal is propagated across the array in the opposite direction by a master clock generator and distributor circuit at the other end of the array. This differs from the practice in the prior art where both signals are propagated together in the same direction on separate lines. A key factor in eliminating clock skew is the slope or rise time of the ramps in the trapezoidal signals. This rise time is tailored so that the delay time for propagation across the width or length of the integrated circuit is slightly less than the rise time. Thus, for example, if the propagation delay for a clock signal to travel across the width of the integrated circuit is 400 picoseconds, the rise time for the clock signal ramps may typically be set at 600 picoseconds.

At the top and bottom of each column of cells in the array there is located a secondary clock receiver and distributor circuit (hereafter sometimes alternatively referred to as satellite receivers or column clock drivers). These circuits are represented by the small triangles, of which circuit 20 is typical, on the clock propagation lines 16 and 18 traversing the top edges of the array in the horizontal direction. The purpose of these satellite clock receivers and distributor circuits is to regenerate the clock signals, i.e., reshape them, and buffer the clock signals from the master clock distributor cells and then transmit the regenerated clock signals up and down the column. The column clock driver circuits reshape the clock signals from the master clock distributors so that the rise time of the clock ramp slightly exceeds the propagation delay encountered as the reshaped clock signal travels up or down one column in the array. If this propagation delay is the same as the propagation delay in travelling across the array on conductor 16, the column clock driver does not need to alter the rise time of the incoming clock pulse from the master clock distributor, and may simply buffer the pulse and retransmit it. The column clock drivers are structured so that one of the clock signals, for example the true signal 22 in FIG. 2, is propagated down the column while the complementary clock signal, i.e., signal 24 in FIG. 2, is simultaneously propagated up the column. The cells in each column are coupled by a clock line of which clock buses 26 and 28 are typical. Each of these column clock buses is comprised of an A conductor which carries the true clock signal in one direction and a B conductor which carries the complement clock signal in the opposite direction. The reshaping by the column clock drivers or "secondary clock receiver and distributor circuits" located at the top and bottom of each column clock bus is designed to insure that the rise time of the clock signal ramp is slightly longer than the propagation delay the clock signal encounters in travelling from the top of the array to the bottom thereof for reasons which will become apparent below in the discussion of how clock skew is eliminated or reduced substantially using the teachings of the invention.

The master clock distributor cells 1, 2, 3 and 4 and the satellite clock receiver and distributor cells such as cells 20 and 21 which drive each row cooperate to insure that clock skew is eliminated or substantially reduced in high clock speed, field programmable integrated circuits. Basically, clock skew is eliminated across the entire integrated circuit by propagating the true and complement clock signals from opposite directions from opposite sides of the integrated circuit and tailoring the clock signal rise times to be slightly longer than the propagation time across the integrated circuit. That criteria for the rise time causes the crossover point for the true and complement signals at the position of each cell to occur at the same time regardless of the position of the cell in the array. It is this crossover point which is used to trigger action in the cell and is triggered by the occurrence of the clock signal.

Figure 3:
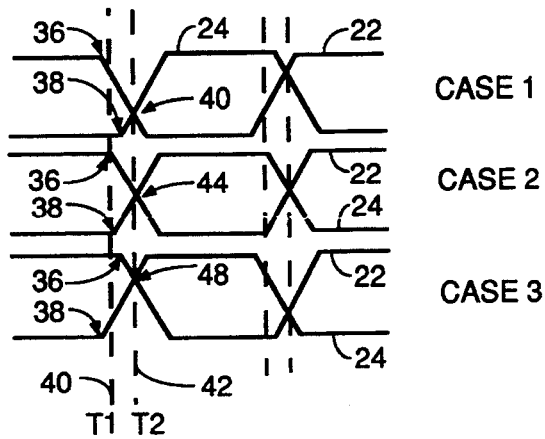
FIG. 3 is a timing diagram illustrating how if the ramps on the differential clock signals are slightly longer (typically about 20% longer or less) than the propagation delay a clock signal experiences in traversing the array, the clock marker or crossover point in amplitude between the true and complement clock signals propagating in opposite directions occurs at the same time.

More specifically, consider case 1 in FIG. 3. This is the situation for a cell 30 in the upper left corner of the array. Assume that master clock distributor cell 1 generates both the true and complement clock signals shown at FIG. 2, but only outputs the true signal 22 on clock bus 16 propagating from left to right toward master clock distributor cell 2. Likewise, master clock distributor cell 2 generates both the true and complement clock signals shown at FIG. 2, but only outputs the complement signal 24 on clock bus 16 propagating from right to left toward master clock distributor cell 1. Because of the proximity of cell 30 to master clock distributor cell 1 and the remoteness of cell 30 from the master clock distributor cell 2, cell 30 receives the true clock signal 22 well before the complement signal 24 arrives. Note from FIG. 2, the start of the upward transition at 36 for true clock signal 22 coincides in time with the start of the downward transition at 38 of the complement clock signal 24 When the two signals are generated in any one of the master clock distributor cells 1, 2, 3 or 4. Note however, that because of propagation delays, the transition 36 in the true clock signal 22 and the transition 38 in the complement clock signal are offset in time from each other. Note that the transition 38 in the complement clock signal 24 arrives later in time than the transition 36 because of the longer propagation delay between master clock distributor 2 and cell 30. Note also that the crossover point 40 between the true and complement clock signals occurs at a time T2 represented by time line 42. The interval between the times T1 and T2 represented by time lines 40 and 42 represents the propagation delay for a signal propagating across the width of the array.

Now consider case 2 in FIG. 3. Case 2 represents the situation for a cell 42 in the middle of the first row in the array where the propagation delay for the true clock signal 22 from the master clock distributor cell 1 to cell 40 is approximately equal to the propagation delay for the complement clock signal 24 to travel from master clock distributor cell 2 to the cell 40. Note how in case 2, the transitions 36 and 38 arrive at cell 40 at approximately the same time, and the crossover point 44 occurs at time T2 represented by time line 42 which is the same time that the crossover point occurred for cell 30 on the left edge of the array despite the fact that the two cells are separated by approximately ½ the width of the array.

Case 3 in FIG. 3 illustrates the situation at the location of a cell 46 in the upper right hand corner of the array. For this cell, the true clock signal 22 reaches the cell later than the complement clock signal.24 as indicated by the fact that transition 38 in the complementary clock signal 24 occurs earlier in time than transition 36 in the true clock signal. Obviously this situation arises from the fact that the cell 46 is much closer to the master clock distribution cell, i.e., the source of the complementary clock signal, than it is to the master clock distribution cell 1 from which the true clock signal propagates. Nevertheless, the crossover between the true and complement clock signals at 48 occurs at time T2 represented by time line 42 and therefore occurs at the same time as crossovers 40 and 44 for cases 1 and 2, respectively. The crossover points 40, 44 and 48 represent the effective clock arrival times at the columns in which cells 30, 42 and 46 are resident. These effective clock arrival times are the same for all three of the columns in which cells 30, 42 and 46 are resident.

An identical process occurs an bus 18 running along the bottom edge of the array. Master clock distributor 3 generates and distributes one or the other of the clock pulse trains illustrated in FIG. 2. It does not matter which of these two signals are output on clock bus 18 by the master clock distributor cell 3, so long as the complementary clock signal is simultaneously output on clock bus 18 so as to travel in the opposite direction by master clock distributor cell 4. The two clock signals travelling in opposite directions on clock bus 18 must be launched at substantially the same time by the master clock distributor cells 3 and 4, the launch times by master clock distributor cells 3 and 4 must be substantially simultaneous with the launch times of the master clock distributors 1 and 2, and each of the launched clock signals must have its rise times set to slightly exceed the propagation delay along bus 16 or 18. Under those conditions, the effective clock arrival times at the secondary clock receiver and distributor cells such as cells 20, 21 and 23 will be the same.

The column driver circuits such as circuits 20 and 21 located at the top and bottom of each column, must receive the two clock signals propagating in opposite directions, and generate differential clock signals which have rise times slightly longer than the propagation delay for a clock signal to propagate up or down the column. The column driver at the top of the column must then launch one of these clock signals down the column simultaneously with the launch by the column driver on the other end of the column of the complementary clock signal.

Because the rise time of both the tree and complement clock signals is slightly longer than the propagation delay across the integrated circuit, the effective arrival time for the clock signal at each column's two secondary clock receiver and distributors (column drivers) will be the same, and each of these column drivers can then generate and launch clock signals to propagate up and down the associated column clock lines such as clock buses 26 and 28. Thus, clock skew is eliminated or substantially reduced with this method and apparatus regardless of the position of a cell in the array. This insures that each cell will experience the same setup and hold times for their input data signals regardless of which direction signals are propagating along the integrated circuit and regardless of changes in the direction and length of signal flow paths as the integrated circuit is reprogrammed in the field.

Figure 4:
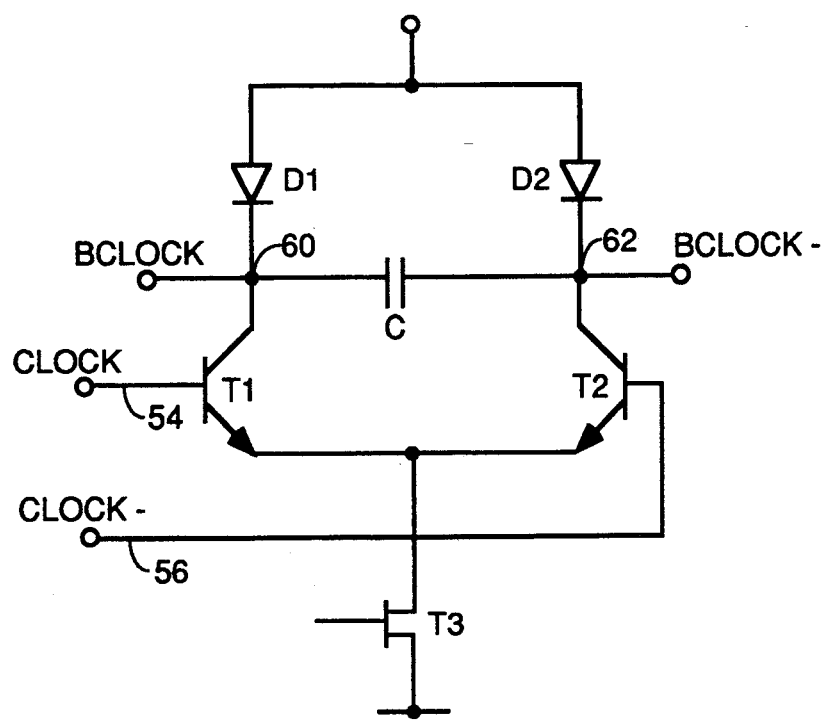
FIG. 4 shows a typical differential clock generator circuit of a type suitable for use as the master clock receiver and distributor circuits and for each secondary clock receiver and distributor circuit.

Referring to FIG. 4, there is shown a circuit diagram of a typical ramp generator circuit such as may be used for the master clock receiver and distributor cells 1, 2, 3 and 4 in FIG. 1 and for the secondary clock receiver and distributor cells such as column drivers 20, 21 and 23. There is nothing critical about the particular design shown in FIG. 4 for a ramp circuit for use either as the master clock distributor cells or the secondary clock distributors, and any ramp circuit which can generate ramp clock signals having the following characteristics will suffice. First, the ramp generator must be able to receive both the true and complement clock signals simultaneously and must start generating its ramp at the time when the true and complement clock signals "cross", i.e., have equal voltage. Second, the ramp must have a rise time which is slightly longer than the propagation delay across the array.

The way in which the ramp circuit of FIG. 4 meets these two criteria is as follows. The circuit of FIG. 4 is a differential amplifier which receives the true clock signal at differential input 54 and the complementary clock signal at differential input 56. When the level of the true clock signal is higher than the level of the complementary clock signal, the transistor T1 is turned on and T2 is turned off. This causes capacitor C to charge to a predetermined voltage state as transistor T1 draws collector current through the capacitor C from diode D2 and drains it through the common emitter constant current source transistor T3. As the capacitor C charges up, the current drawn from diode D2 decreases and the current drawn through diode D1 begins to increase to keep the total collector current equal. The rising voltage on the capacitor C is used as the clock signal ramp. The nodes 60 and 62 are coupled to the two opposite plates of the capacitor C, and it is on these nodes that the new regenerated clock signals appear for transmission. When the crossover point is reached for the complementary input clock signals applied to nodes 54 and 56, transistor T1 starts to turn off and transistor T2 starts to turn on. This alters the flow of collector current because as the collector current of T1 becomes less, the collector current of T2 will become more so that the total current flowing through constant current source T3 is constant. At the crossover point where the voltage of the true clock signal on line 54 is equal to the voltage of the complementary clock signal on line 56, the direction of current flow through the capacitor C reverses, and it begins to discharge and charge up in the opposite direction of polarity. The series resistance of the diodes D1 and D2 and the transistors T1 and T2 in the on state along with the series resistance of the constant current source transistor T3 coupled with the capacitance of capacitor C establish the RC time constant which set the rise time of the ramps generated by the capacitor C.

The ramp circuit of FIG. 4 is used at each corner of the array as the master clock receiver and distributor cells 1, 2, 3 and 4 by coupling an external source of a true and complementary, ramp clock signals to the differential clock inputs 54 and 56 such that the differential clock signals reach each corner master clock receiver and distributor cell simultaneously. Then, the true regenerated clock signal node 60 of master clock distributor cell 1 is coupled to the A conductor of clock bus 16 in FIG. 1 and the complement, regenerated clock signal node 62 of master clock distributor cell 2 is coupled to the B conductor of clock bus 16. Likewise, the true, regenerated clock signal node 60 of master clock distributor cell 3 is coupled to the A conductor of clock bus 18 in FIG. 1 and the complement, regenerated clock signal node 62 of master clock distributor cell 4 is coupled to the B conductor of clock bus 18.

The secondary clock receiver and distributor circuits 20, 21, 23 etc. all have the structure shown in FIG. 4 or some other equivalent ramp generation circuit structure. The differential clock inputs 54 and 56 are coupled to clock bus 16. Each of clock buses 16, 17, 18 and 19 is comprised of two conductors, one of which carries the true clock signal and the other of which carries the complement clock signal which will be designated conductors A and B in each bus. In embodiments using buses 16 and 18 and not buses 17 and 19, the true clock input 54 of each secondary clock receiver and distributor coupled to bus 16 will be coupled to the A conductor of bus 16 and the complementary clock input 56 will be coupled to the B conductor of bus 16. The true, regenerated clock signal output 60 of each of these secondary clock receivers coupled to bus 16 will be coupled to their respective column clock lines such as clock buses 26 and 28. Likewise, the true clock input 54 of each secondary clock receiver and distributor coupled to bus 18 will be coupled to the A conductor of bus 18 and the complementary clock input 56 thereof will be coupled to the B conductor of bus 18. The complement, regenerated clock signal output 62 of each of these secondary clock receivers coupled to bus 18 will be coupled to their respective column clock lines such as clock buses 26 and 28.

In alternative embodiments where vertical propagation is preferred, lines 17 and 19 are present and lines 16 and 18 are absent. In such a case, the true regenerated clock signal node 60 of master clock distributor cell 1 is coupled to the A conductor of clock bus 17 in FIG. 1 and the complement regenerated clock signal node 62 of master clock distributor cell 3 is coupled to the B conductor of clock bus 17. Likewise, the true regenerated clock signal node 60 of master clock distributor cell 2 is coupled to the A conductor of clock bus 19 in FIG. 1 and the complement, regenerated clock signal node 62 of master clock distributor cell 4 is coupled to the B conductor df clock bus 19. The secondary clock receiver and distributor circuits are connected in analogous fashion to that described above for the column clock drivers 20 and 21 except that they drive the A and B conductors of the clock bus associated with each row of the array.

What is claimed

1. An apparatus for distributing clock waveforms on an integrated circuit comprised of a plurality of rows and columns of cells, each of which can perform some logic function, comprising:

an integrated circuit upon which is formed an array of cells arranged into at least one row and at least one column;

a first clock bus comprised of first and second electrically isolated conductors running parallel to a first edge of said array;

a second clock bus comprised of first and second electrically isolated conductors running parallel to an edge of said array opposite said first edge;

a first pair of master clock receivers and distributor circuits, located such that one member of said first pair of master clock receivers and distributor circuits is at one end of said first clock bus and has an input for receiving a first master clock input signal and the other member of said first pair of master clock receivers and distributor circuits is located at the opposite end of said first clock bus and has an input for receiving a second master clock input signal, said first pair of master clock receiver and distributor circuits including means for generating a first true differential clock signal at one end of said first clock bus and a first complement differential clock signal at the opposite end of said first clock bus, each of said first true and first complement differential clock signals including a ramp portion the duration of which is longer than the propagation delay of a clock signal propagating across said first clock bus, said first pair of master clock receiver and distributor circuits coupled to said electrically isolated conductors of said first clock bus so as to drive said first true differential clock signal across said first conductor of said first clock bus in a first direction upon receipt of a first master clock input signal at said input for receiving a first master clock input signal and so as to drive said first complement differential clock signal across said second conductor of said first clock bus in a second direction opposite said first direction upon receipt of a second master clock input signal;

a second pair of master clock receivers and distributor circuits, located such that one member of the pair is at one end of said second clock bus and has an input for receiving a third master clock input signal and the other member of the pair is located at the opposite end of said second clock bus and has an input for receiving a fourth master clock input signal, each said master clock receiver and distributor circuit in said second pair of master clock receiver and distributor circuits including means for generating a second true differential clock signal at one end of said second clock bus and a second complement differential clock signal at the opposite end of said second clock bus, each of said second true and second complement differential clock signals including a ramp portion the duration of which is longer than the propagation delay of a clock signal across said second clock bus, said second pair of master clock receiver and distributor circuits coupled to said electrically isolated conductors of said second clock bus so as to drive said second true differential clock signal across said first conductor of said second clock bus in a first direction upon receipt of said third master clock input signal and so as to drive said second complement differential clock signal across said second conductor of said second clock bus in a second direction opposite said first direction upon receipt of said fourth master clock input signal;

and wherein each of said first, second, third and fourth master clock input signals arrives simultaneously at said inputs of said first and second pairs of master clock receiver and distributor circuits, and wherein each cell in each column in said array is coupled to one of a plurality of column clock buses each of which corresponds to a particular column of said array and each of which is comprised of first and second electrically isolated conductors; and further comprising a pair of secondary clock receivers and distributor circuits associated with each said column clock bus, each said pair of secondary clock receiver and distributor circuits coupled to said first and second clock buses so as to receive said first true and first complement differential clock signals propagating in opposite directions on said first and second clock buses, and including means for generating therefrom new true and complement differential column clock signals each of which includes a ramp portion the duration of which is longer than the propagation delay of a column clock signal travelling down said corresponding column clock bus, each said pair of secondary clock receiver and distributor circuits being coupled to the electrically isolated conductors of said column clock bus corresponding to the column associated with said pair of second clock receiver and distributor circuits so as to drive said true differential column clock signal down said first conductor of said corresponding column clock bus in a first direction commencing at the time said first true and first complement differential clock signals counterpropagating on said first clock bus have substantially equal amplitudes at the location of the corresponding column of said array, and so as to drive said complement differential column clock signal up said second conductor of said corresponding column clock bus in a direction opposite said first direction of propagation of said true differential column clock signal, said propagation in said second direction commencing at a time when the second true and second complement differential clock signals counterpropagating on said second clock bus have substantially equal amplitudes at the location of the corresponding column;

and wherein each said cell in each said column of said array uses the crossover point between the true and complement differential column clock signals counterpropagating on each of said column clock buses as the clock marker.

2. The apparatus of claim 1 wherein said array is comprised of a plurality of rows and columns of cells of a field programmable gate array.

3. The apparatus of claim 2 wherein each said cell is capable of performing one or more logical functions, and wherein each cell contains programmable connection circuitry which may be programmed by a user such that each cell may be connected to at least some if not all of the other cells.

4. A process for delivering high speed clock signals to circuits in an array comprised of a plurality of rows and columns of circuits while substantially reducing clock skew in delivering said clock signals to each circuit in said array, said array having first, second, third and fourth corners, and having a first clock bus having first and second conductors running between said first and second corners, and having a second clock bus having first and second conductors running between said third and fourth corners, and having a plurality of column clock buses each having first and second conductors associated with a particular column and each coupled to at least some of the circuits in said column, comprising:

generating true and complement clock signals at said corners of said array from master true and complement clock signals such that a true clock signal is generated at said first corner of said array and a complement clock signal is generated at said second corner of said array, where said first and second corners of said array share a first edge thereof, and so that a true clock signal is generated at said third corner of said array and a complement clock is generated at said fourth corner of said array, where said third and fourth corners of said array share a second edge thereof opposite said first edge, and wherein said master clock signals must be delivered substantially simultaneously to each said corner of said array, each said true and complement differential clock signal generated at said first, second, third and fourth corners of said array having a ramp portion the duration of which exceeds the propagation delay experienced by a clock signal as it propagates along either said first or second clock bus;

transmitting said true clock signal generated at said first corner of said array along said first conductor of said first clock bus toward said second corner, and simultaneously transmitting said complement clock signal generated at said second corner of said array along said second conductor of said first clock bus toward said first corner of said array;

transmitting said true clock signal generated at said third corner of said array along said first conductor of second clock bus toward said fourth corner of said array, and simultaneously transmitting said complement clock signal generated at said fourth corner along said second conductor of said second clock bus toward said third corner of said array;

receiving at the top of each column clock bus said true and complement clock signals counterpropagating along said first and second conductors of said first clock bus and regenerating therefrom on said first conductor of said column clock bus at the location of each said column a new true column clock signal each of which has a ramp portion the duration of which exceeds the propagation delay for a column clock signal to propagate down said column clock bus, said new true column clock signal commencing propagation down said first conductor of the corresponding column clock bus at the time when said true and complement clock signals on said first and second conductors of said first clock bus are substantially equal in amplitude at the position of the corresponding column;

receiving at the bottom of each column clock bus said true and complement clock signals counterpropagating along said first and second conductors of said second clock bus and regenerating therefrom on said second conductor of said column clock bus at the location of each said column a new complement column clock signal which has a ramp portion the duration of which exceeds the propagation delay for a clock signal to propagate down said column clock bus, said complement column clock signal commencing propagation on said second conductor of the corresponding column clock bus in a direction opposite the direction of propagation of said true column clock signal at the time when said true and complement clock signals on said first and second conductors of said second clock bus are substantially equal in amplitude at the position of the corresponding column; and using the crossover point where the amplitudes of said true and complement column clock signals counterpropagating on said first and second conductors of said column clock buses are substantially equal as the clock marker for each said cell coupled to said column clock bus.

5. A process of transmitting high speed clock signals to all cells in an array comprised of a plurality of rows and columns of said cells of a field programmable integrated circuit such as a gate array while substantially eliminating clock skew, comprising:

generating high speed true and complement differential, trapezoidal clock signals at each corner of said array, said true and complement differential, trapezoidal clock signals being generated simultaneously at each corner of said array by master clock generator and distributor circuits upon simultaneous arrival at each corner of said array of an externally generated master clock signal, each said true and complement differential, trapezoidal clock signal having a ramp portion the duration of which is longer than the propagation delay a true or complement differential, trapezoidal clock signal experiences traversing a clock bus running along an edge of said array orthogonal to the columns of said array, and transmitting the true differential trapezoidal clock signals from a first edge of the array parallel to said columns of said array to a second edge parallel to said first edge along first and second clock buses on opposite sides of said array, each of said first and second clock buses being oriented so as to be orthogonal to the columns thereof;

receiving said high speed true and complement differential, trapezoidal clock signals at satellite clock receiver and distributor cells located at the top and bottom ends of a plurality of column clock buses and generating therefrom true and complement differential trapezoidal column clock signals at each of said top and bottom ends of each said column clock bus, each said true and complement differential, trapezoidal column clock signal having a ramp portion the duration of which exceeds the propagation delay experienced by a true or complement differential trapezoidal column clock signal propagating the length of a column of said array on a column clock bus each said true and complement differential, trapezoidal column clock signal pair corresponding to a particular column commencing propagation on the corresponding column clock bus at the time when said true and complement differential trapezoidal clock signals counterpropagating on said first and second clock buses are substantially equal in amplitude at the location of the corresponding column, and transmitting the true differential, trapezoidal column clock signals generated at the top of each column clock bus of the array to the bottom of said column clock bus along a conductor of said column clock bus designated to carry said true differential trapezoidal column clock signal for that column, and transmitting the complement differential, trapezoidal column clock signal generated at the bottom of each column up the corresponding column clock bus along a conductor of said column clock bus designated to carry said complement differential, trapezoidal column clock signal corresponding to said column to the top of the column;

using the crossover point in amplitude between the true and complement differential trapezoidal column clock signals propagating on each column clock bus at the location of each cell as the clock marker for that cell.

6. An apparatus for distributing high speed clock signals on an integrated circuit comprised of an array of cells which can be interconnected with each other by a user in a programmable fashion, said array comprising a plurality of cells arranged into a plurality of rows and columns, comprising:

first means for receiving a first pair of externally-generated, differential clock signals delivered simultaneously to each corner of said array and for simultaneously generating therefrom first and second differential clock signals which are to be counterpropagated across the top of said array in opposite directions along first and second conductors of a first bus which is parallel to the first row of said array, said first and second differential clock signals each having ramp portions which have a rise time which exceeds the propagation delay for a differential clock signal to traverse the array along said first bus, and for simultaneously generating from said first pair of externally-generated differential clock signals third and fourth differential clock signals which are to be counterpropagated across the bottom of said array in opposite directions along first and second conductors of a second bus which is parallel to the last row in said array, and for simultaneously transmitting said first and third differential clock signals from the upper and lower corners of the left side of said array, respectively, such that said first and third differential clock signals simultaneously propagate across said array from left to right on said first conductors of said first and second buses, respectively, and for simultaneously transmitting said second and fourth differential clock signals from the upper and lower corners on the right side of said array, respectively, such that said second and fourth differential clock signals simultaneously propagate on said second conductors of said first and second buses, respectively, across said array from right to left whereby the direction of propagation of said second and fourth differential clock signals is opposite the direction of propagation of said first and third differential clock signals, said transmitting of said second and fourth differential clock signals being simultaneous with the transmitting of said first and third differential clock signals; and second means for generating on a column clock bus corresponding to each said column of said array differential column clock signals having ramp portions with rise times which exceed the propagation delay of said column clock buses at a predetermined time for each said column, and for counterpropagating said differential column clock signals in opposite directions along each said column clock bus in said array at said predetermined time for each said column, said predetermined time being determined for each column as the time when said first, second, third and fourth differential clock signals counterpropagating on said first bus and second bus have equal amplitudes at the position of said column, each said column clock bus including first and second electrically isolated conductors, said second means including a plurality of top secondary clock receiver and distributor circuits, one for each column and located at the top of each said column clock bus each said top secondary clock receiver and distributor circuit coupled to at least said first conductor of the corresponding said column clock bus, said top secondary clock receiver and distributor circuits being coupled to said first and second conductors of said first bus so as to receive said first and second differential clock signals transmitted by said first means from the upper right and left corners of said array and generating therefrom at the top of each column a first differential column clock signal at said predetermined time for each said column and propagating on said first conductor of the corresponding clock bus, said second means further including a plurality of bottom secondary clock receiver and distributor cells, one for each column and located at the bottom of the corresponding column clock bus, each said bottom secondary clock receiver and distributor cell coupled to said first and second conductors of the corresponding column clock bus and each coupled to said first and second conductors of said second bus so as to receive said third and fourth differential clock signals counterpropagating thereon and transmitted from said first means from the lower left and right corners of said array, each said bottom secondary clock receiver and distributor circuit for generating from said third and fourth differential clock signals counterpropagating on said second bus a second differential column clock signal at the bottom of each column clock bus, each of said first, and second, differential column clock signals having ramp portions with rise times which exceed the propagation delay of a differential column clock signal propagating down a column clock bus of said array, each said secondary clock receiver and distributor circuit at any particular column generating said first and second differential column clock signals at said predetermined time for that column, said second differential column clock signal being symmetrical and differential with said first differential column clock signal, each said top secondary clock receiver and distributor circuit being structured and coupled to said first bus and said column clock bus for the corresponding column so as to transmit said first differential column clock signal down the first conductor of the associated column clock bus at the predetermined time for said column, and each said bottom secondary clock receiver and distributor circuit for transmitting said second differential column clock signal simultaneously with the transmission of said first differential column clock signal for the corresponding column, said second differential column clock signal being transmitted in a direction on the corresponding column clock bus so as to counterpropagate up the associated column clock bus on a second conductor of the corresponding said column clock bus.

7. An apparatus for distributing high speed clock signals on an integrated circuit comprised of an array of cells which can be interconnected with each other by a user in a programmable fashion, said array comprising a plurality of cells arranged into a plurality of rows and columns, each column having a column clock bus comprised of first and second conductors associated therewith, said array also having a first bus comprised of first and second conductors running parallel to the top row of said array and a second bus comprised of first and second conductors running parallel to the bottom row of said array, comprising:

first means for receiving a first pair of externally generated differential clock signals generated outside said integrated circuit and delivered simultaneously to each corner of said array and for generating therefrom first and second complementary differential clock signals having ramp portions each of which has a rise time which exceeds the propagation delay for a differential clock signal to propagate across the array on said first bus, and for simultaneously transmitting said first and second complementary differential clock signals from opposite ends of said first bus such said the true and complement differential clock signals counterpropagate in opposite directions on said first and second conductors of said first bus, said counterpropagation starting simultaneously at the time when the amplitudes of said first pair of externally generated differential clock signals are equal and for generating from said first pair of external differential clock signals third and fourth complementary differential clock signals having ramp portions each of which has a rise time which exceeds the propagation delay for a differential clock signal to propagate across the array on said second bus, and for simultaneously transmitting said third and fourth complementary differential clock signals from opposite ends of said second bus such that said third and fourth differential clock signals counterpropagate in opposite directions on said first and second conductors of said second bus, said counterpropagation starting simultaneously at the time when the amplitudes of said first pair of external differential clock signals are equal and simultaneously with the transmission of said first and second complementary differential clock signals on said first bus; and second means coupled to the bottom and top of each column clock bus, for generating true and complement differential column clock signals at the top of each column clock bus from said first and second complementary differential clock signals counterpropagating on said first bus, and for generating true and complement differential clock signals at the bottom of each column clock bus from said third and fourth complementary differential clock signals counterpropagating on said second bus, and, at the time the amplitudes of said first and second complementary differential clock signals are equal at the top of each column, transmitting said true differential column clock signal generated at the top of the corresponding column down the corresponding column clock bus, and, at the time the amplitudes of said third and fourth complementary differential clock signals are equal at the bottom of each column, transmitting said complementary differential column clock signal generated at the bottom of the corresponding column so as to propagate up the corresponding clock bus thereby creating simultaneously transmitted, complementary differential column clock signals counterpropagating on each column clock bus, each of said true and complement differential column clock signals generated at the top and bottom of each said column clock bus having ramp portions with rise times which exceed the propagation delay of a differential clock signal propagating down said column clock bus such the time at the location of each cell when the amplitudes are equal of the counterpropagating complementary differential column clock signals serves as a clock marker which substantially eliminates clock skew.

8. A clock pulse distribution apparatus for a circuit comprised of a plurality of cells arranged into a rectangular array comprising at least two rows and at least two columns, comprising:

a plurality of input ports located at the corners of said array for simultaneously receiving master clock signals from a master clock;

a first master clock bus having first and second conductors running along a first edge of said array;

a second master clock bus having first and second conductors running along a second edge of said array which is parallel to and opposite said first edge;

first master clock generation means coupled to one of said plurality of input ports and to a first conductor at a first end of said first master clock bus, for receiving a said master clock signals and outputting on said first conductor a true clock pulse having a rise time which is longer than the time it takes said true clock pulse to propagate along said first edge of said array on said first conductor;

second master clock generation means coupled to a different one of said plurality of input ports than said first master clock generation means and to a second conductor of said first master clock bus at the end of said first master clock bus which is opposite said first end, for receiving said master clock signals and outputting on said second conductor a complementary clock pulse having a rise time which is longer than the time it takes said clock pulse to propagate along said first edge of said array on said second conductor and which is substantially identical to the rise time of said true clock pulse;

third master clock generation means coupled to a different one of said plurality of input ports than said first and second master clock generation means and to a first conductor at a first end of said second master clock bus, for receiving said master clock signals and outputting on said first conductor a true clock pulse having a rise time which is longer than the time it takes said true clock pulse to propagate along said second edge of said array on said first conductor;

fourth master clock generation means coupled to a different one of said plurality of input ports than said first, second and third master clock generation means and to a second conductor of said second master clock bus at the end of said second master clock bus which is opposite said first end, for receiving said master clock signals and outputting on said second conductor a complementary clock pulse having a rise time which is longer than the time it takes said complementary clock pulse to propagate along said first edge of said array on said second conductor and which is substantially identical to the rise time of said true clock pulse;

and for each column of said array:

a first column clock driver means coupled to said first and second conductors of said first master clock bus and to each cell in said column, for outputting a true clock column pulse at the time when said true and complementary clock signals output by said first and second master clock generation means are equal in amplitude at the location of said column, said true clock column pulse having a rise time longer than the propagation delay for said true clock column pulse to propagate to all cells in said column;

a second column clock driver means coupled to said first and second conductors of said second master clock bus and to each cell in said column, for outputting a complementary clock column pulse at the time when said true and complementary clock signals output by said third and fourth master clock generation means are equal in amplitude at the location of said column, said complementary clock column pulse having a rise time longer than the propagation delay for said complementary clock column pulse to propagate to all cells in said column and which is substantially
equal to the rise time of said true clock column pulse; and wherein the clock arrival time for any particular cell of said array is the time when the amplitudes of the true and complementary clock column pulses which are counterpropagating along each column are equal in amplitude at the location of the particular cell.

* * * * *